(12) United States Patent
Asami et al.

(10) Patent No.: US 8,471,363 B2
(45) Date of Patent: Jun. 25, 2013

(54) SEMICONDUCTOR DEVICE AND METHOD OF MANUFACTURING THE SAME

(75) Inventors: Kazushi Asami, Okazaki (JP); Yasuhiro Kitamura, Chiryu (JP)

(73) Assignee: Denso Corporation, Kariya (JP)

( * ) Notice: Subject to any disclaimer, the term of this patent is extended or adjusted under 35 U.S.C. 154(b) by 41 days.

(21) Appl. No.: 13/246,065

(22) Filed: Sep. 27, 2011

(65) Prior Publication Data

US 2012/0080772 A1  Apr. 5, 2012

(30) Foreign Application Priority Data

Oct. 4, 2010  (JP) .................. 2010-224695

(51) Int. Cl.
*H01L 21/02* (2006.01)
*H01L 21/8222* (2006.01)

(52) U.S. Cl.
USPC .... 257/532; 257/534; 257/599; 257/E29.346; 257/E29.345; 438/329; 438/386

(58) Field of Classification Search
USPC ............ 257/520, 532, 534, 599, E29.346, 257/E29.345, E29.343; 438/243, 329, 386
See application file for complete search history.

(56) References Cited

U.S. PATENT DOCUMENTS

| 7,960,773 B2 * | 6/2011 | Chang et al. .................. 257/307 |
| 2006/0001174 A1 | 1/2006 | Matsui |
| 2006/0131691 A1 * | 6/2006 | Roozeboom et al. ......... 257/534 |

FOREIGN PATENT DOCUMENTS

| JP | A-2007-081100 | 3/2007 |
| WO | WO 9844522 A2 * | 10/1998 |

* cited by examiner

*Primary Examiner* — Jose R Diaz
(74) *Attorney, Agent, or Firm* — Posz Law Group, PLC

(57) ABSTRACT

A semiconductor device includes a substrate, a first single conductor, a single insulator, and a second single conductor. The substrate includes first and second regions located adjacent to each other. The first region has blind holes, each of which has an opening on a front surface of the substrate. The second region has a through hole penetrating the substrate. A width of each blind hole is less than a width of the through hole. The first single conductor is formed on the front surface of the substrate in such a manner that an inner surface of each blind hole and an inner surface of the through hole are covered with the first single conductor. The single insulator is formed on the first single conductor. The second single conductor is formed on the single insulator and electrically insulated form the first single conductor.

8 Claims, 11 Drawing Sheets

SEMICONDUCTOR DEVICE AND METHOD OF MANUFACTURING THE SAME

CROSS REFERENCE TO RELATED APPLICATION

This application is based on and claims priority to Japanese Patent Application No. 2010-224695 filed on Oct. 4, 2010, the contents of which are incorporated herein by reference.

TECHNICAL FIELD

The present invention relates to a semiconductor device including a semiconductor substrate having an electrode portion constructed with two conductors that are spaced by an insulator and located in a hole of the semiconductor substrate. The present invention also relates to a method of manufacturing the semiconductor device.

BACKGROUND

As disclosed in, for example, JP-A-2006-19455 corresponding to US 2006/0001174 and JP-A-2007-81100, a semiconductor device including a semiconductor substrate having a through electrode portion for electrically connecting front and back surfaces of the semiconductor substrate has been known. Such a semiconductor device can be reduced in size.

The electrode portion is formed as follows. Firstly, a through hole extending from the front surface to the back surface of the semiconductor substrate is formed by, for example, an etching technique. Then, a first conductor, an insulation layer, and a second conductor are formed in the through hole by, for example, a sputtering technique and a chemical vapor deposition (CVD) technique. The first conductor has a tube shape and is formed on an inner surface of the through hole. The insulation layer has a tube shape and is formed on an inner surface of the first conductor. The second conductor has a column shape and is formed in a hollow of the insulation layer so that the hollow can be filled with the second conductor.

For example, the first conductor is used as a signal line, and the second conductor is used as a ground line. The second conductor is shielded by the first conductor so that noise in the first conductor as a signal line can be reduced.

To increase such a shield effect, it is preferable to increase a capacitance of a capacitor constructed with the first and second conductors spaced by the insulation layer.

The capacitance can be increased by increasing the area of the first and second conductors. However, in the conventional semiconductor device, an increase in the area of the first and second conductors results in an increase in a diameter of the through hole. As a result, the through electrode is increased in size, and the semiconductor device is increased in size.

SUMMARY

In view of the above, it is an object of the present invention to provide a semiconductor device including a semiconductor substrate having an electrode portion constructed with two conductors that are spaced by an insulator and located in a hole of the semiconductor substrate in such a manner that a capacitance between the conductors is increased. It is another object of the present invention to provide a method of manufacturing the semiconductor device.

According to an aspect of the present invention, a semiconductor device includes a semiconductor substrate, a first conductor, an insulator, and a second conductor. The semiconductor substrate has a front surface and a back surface opposite to the front surface. The semiconductor substrate includes a first region and a second region located adjacent to the first region. The first region includes a plurality of blind holes, each of which has an opening on the front surface and a bottom defined by the back surface. The second region includes a through hole extending through the semiconductor substrate from the front surface to the back surface. A width of each blind hole is less than a width of the through hole. The first conductor includes a first portion located on an inner surface of each blind hole, a second portion located on the first surface around the opening of each blind hole, and a third portion located on an inner surface of the through hole. The insulator includes a first portion located on the first portion of the first conductor, a second portion located on the second portion of the first conductor, and a third portion located on the third portion of the first conductor. The second conductor includes a first portion located on the first portion of the insulator and electrically insulated from the first portion of the first conductor, a second portion located on the second portion of the insulator and electrically insulated from the second portion of the first conductor, and a third portion located on the third portion of the insulator and electrically insulated from the third portion of the first conductor. The first portion and the second portion of the first conductor are joined to form a first single continuous conductor. The first portion and the second portion of the second conductor are joined to form a second single continuous conductor. The first portion and the second portion of the insulator are joined to form a single continuous insulator. The first single continuous conductor, the second single continuous conductor, and the single continuous insulator form a capacitor having a predetermined capacitance. The third portion of the first conductor is electrically connected to the first portion and the second portion of the first conductor so that the first portion and the second portion of the first conductor are drawn through the third portion of the first conductor to the back surface of the semiconductor substrate. The third portion of the second conductor is electrically connected to the first portion and the second portion of the second conductor so that the first portion and the second portion of the second conductor are drawn through the third portion of the second conductor to the back surface of the semiconductor substrate.

According to another aspect of the present invention, a method of manufacturing a semiconductor device includes preparing a semiconductor substrate having a front surface and a back surface opposite to the front surface, forming first blind holes and a second blind hole on the front surface side of the semiconductor substrate in such a manner that a depth of the second blind hole is less than a depth of each first blind hole measured from the front surface of the semiconductor substrate, and forming a first single continuous conductor on the front surface side of the semiconductor substrate. The first single continuous conductor has a first portion formed on an inner surface of each first blind hole, a second portion formed on the first surface around an opening of each first blind hole, and a third portion formed on an inner surface of the second blind hole, and a fourth portion formed on the first surface around an opening of the second blind hole. The method further includes forming a single continuous insulator on the front surface side of the semiconductor substrate. The single continuous insulator has a first portion formed on the first portion of the first single continuous conductor, a second portion formed on the second portion of the first single continuous conductor, a third portion formed on the third portion of the first single continuous conductor, and a fourth portion formed on the fourth portion of the first single continuous conductor. The method further includes forming a second single continuous conductor on the front surface side of the semiconductor substrate. The single continuous insulator has a first portion formed on the first portion of the single continuous insulator, a second portion formed on the second portion of the single continuous insulator, a third portion formed on the third portion of the single continuous insulator, and a fourth portion formed on the fourth portion of the single continuous insulator. The method further includes thinning the semiconductor substrate from the back surface side until the third portion of the first single continuous conductor and the third portion of the single continuous insulator are exposed to the back surface of the semiconductor substrate, and removing the third portion of the single continuous insulator exposed to the back surface of the semiconductor substrate so that the third portion of the second single continuous conductor is exposed to the back surface of the semiconductor substrate.

BRIEF DESCRIPTION OF THE DRAWINGS

The above and other objects, features, and advantages will become more apparent from the following description and drawings in which like reference numerals depict like elements. In the drawings.

DETAILED DESCRIPTION OF THE PREFERRED EMBODIMENTS (First Embodiment)

Figure 1:
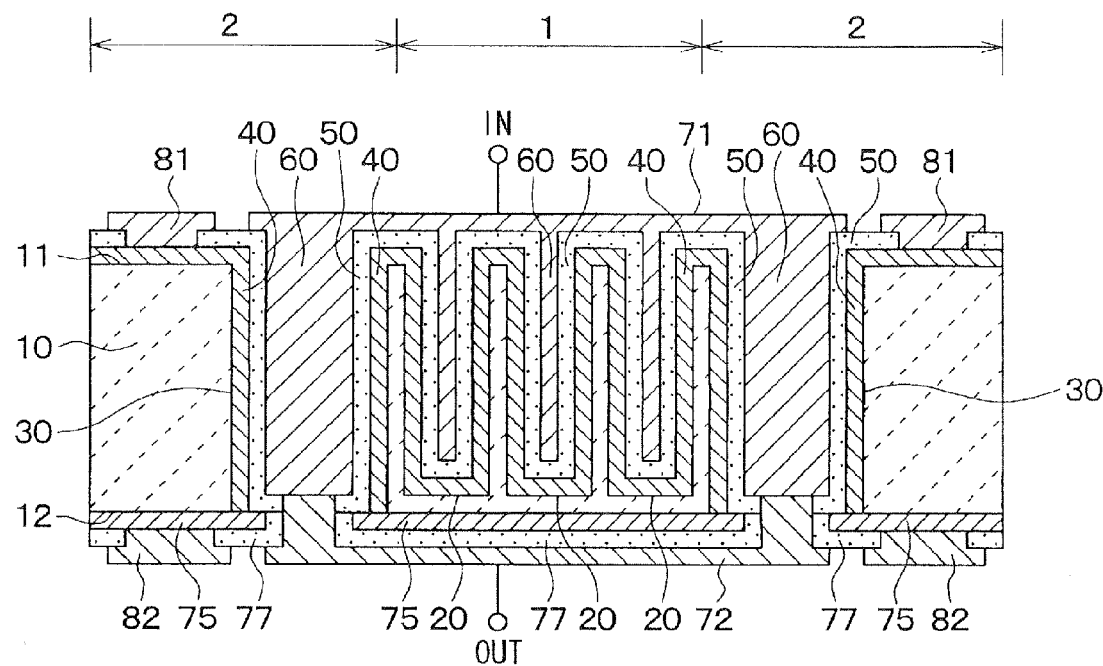
FIG. 1 is a diagram illustrating a cross-sectional view of a semiconductor device according to a first embodiment of the present invention.
Figure 2:
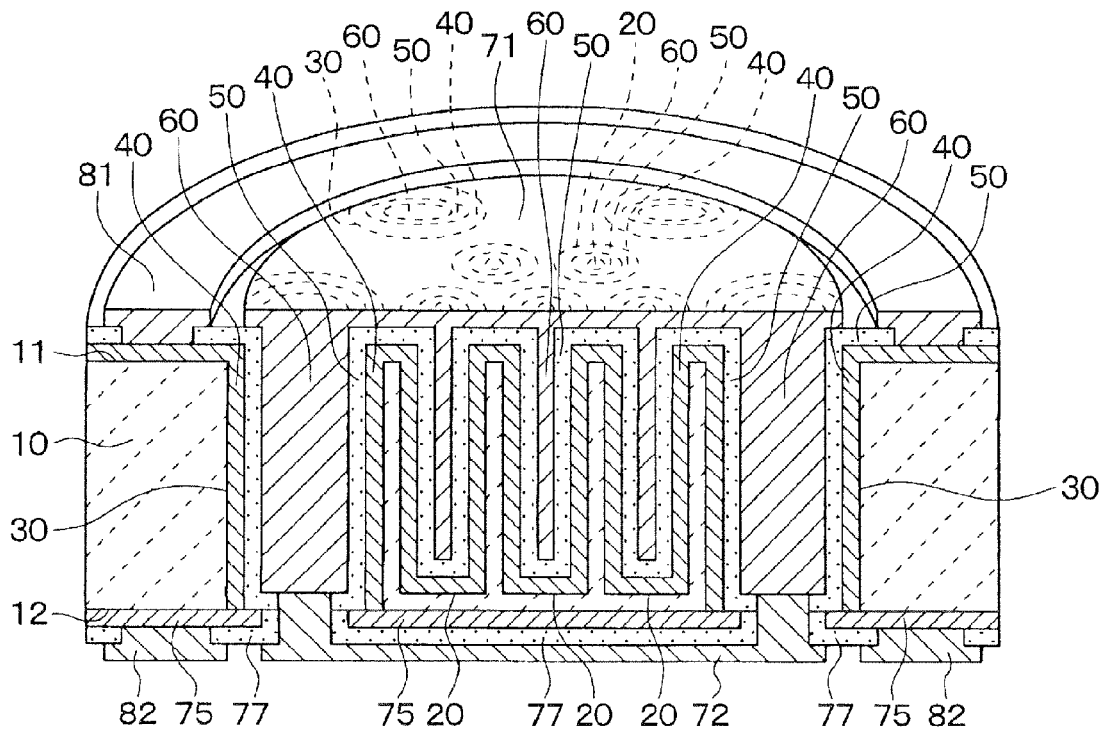
FIG. 2 is a diagram illustrating a cross-sectional perspective view of the semiconductor device according to the first embodiment.

A semiconductor device according to a first embodiment of the present invention is described below with reference to FIGS. 1 and 2. FIG. 1 is a diagram illustrating a cross-sectional view of the semiconductor device, and FIG. 2 is a diagram illustrating a cross-sectional perspective view of the semiconductor device from a front surface 11 side of a semiconductor substrate 10 of the semiconductor device.

The semiconductor substrate 10 has a plate-like shape. The semiconductor substrate 10 has the front surface 11 and a back surface 12 opposite to the front surface 11. As described in detail below, an electrode portion constructed with two conductors 40, 60 spaced by an insulator 50 is formed in blind and through holes of the semiconductor substrate 10.

The semiconductor substrate 10 has a first region 1 and a second region 2. The semiconductor substrate 10 is a typical semiconductor substrate such as a silicon substrate. It is preferable that a resistivity of each of the first region 1 and the second region 2 be 0.1 Ω·cm or less. In such an approach, the semiconductor substrate 10 itself can serve as a current path of the semiconductor device. The resistivity of each of the first region 1 and the second region 2 can be easily reduced to 0.1 Ω·cm or less by adjusting the concentration of impurities doped into the semiconductor substrate 10.

The first region 1 has blind holes 20. The blind holes 20 are arranged as a group in the first region 1. Each blind hole 20 is circular and extends from the front surface 11 toward the back surface 12. The blind hole 20 has an opening on the front surface 11. The blind hole 20 does not reach the back surface 12 and has a bottom inside the semiconductor substrate 10. That is, the bottom of the blind hole 20 is defined by the back surface 12.

The second region 2 is located adjacent to the first region 1 and has through holes 30. Each through hole 30 is circular and penetrates the semiconductor substrate 10 in a thickness direction of the semiconductor substrate 10 perpendicular to each of the front surface 11 and the back surface 12. That is, the through hole 30 extends through the semiconductor substrate 10 from the front surface 11 to the back surface 12. Thus, the through hole 30 has an opening on each of the front surface 11 and the back surface 12. According to the first embodiment, the first region 1 is substantially circular in plane, and the second region 2 is located around the first region 1 so that the first region 1 can be surrounded by the second region 2. Thus, the group of the blind holes 20 is surrounded by the through holes 30.

As described above, the blind hole 20 and the through hole 30 are circular. The blind hole 20 is smaller in diameter than the through hole 30. It is noted that the blind hole 20 and the through hole 30 can have a shape other than a circular shape. In such a case, the blind hole 20 is smaller in width than the through hole 30.

As described later, according to the first embodiment, the blind hole 20 and the through hole 30 are formed at the same time by trench etching by using the fact that the etching rate increases with an increase in the hole diameter.

In the first region 1 of the semiconductor substrate 10, a first conductor 40 having a tube shape with a bottom is located in the blind hole 20 so that an inner surface of the blind hole 20 can be covered with the first conductor 40. A second conductor 60 is located inside the tube-shaped first conductor 40 in the blind hole 20. An insulator 50 is located between the first conductor 40 and the second conductor 60 in the blind hole 20 in such a manner that the first conductor 40 and the second conductor 60 can be electrically insulated from each other by the insulator 50. Thus, each blind hole 20 is filled with the first and second conductors 40, 60 spaced by the insulator 50.

Specifically, the first conductor 40 is located on the inner surface of the blind hole 20. The insulator 50 has a tube shape with a bottom and is located on an inner surface of the first conductor 40. The second conductor 60 has a column shape and is located in a hollow of the insulator 50 so that the hollow of the insulator 50 can be filled with the second conductor 60.

More specifically, the first conductor 40, the insulator 50, and the second conductor 60 are stacked in this order from the inner surface of the blind hole 20 to the center of the blind hole 20 to form a sandwich structure extending in a depth direction of the blind hole 20 (i.e., in the thickness direction of the semiconductor substrate 10). That is, a stacked direction in which the first conductor 40, the insulator 50, and the second conductor 60 are stacked is perpendicular to the depth direction of the blind hole 20.

It is preferable that the first conductor 40 and the second conductor 60 have a resistivity less than that of the semiconductor substrate 10. For example, the first conductor 40 and the second conductor 60 can be made of metal such as copper (Cu), aluminum (Al), or tungsten (W). For example, the first conductor 40 and the second conductor 60 can be formed by a sputtering technique, a CVD technique, or a plating technique. It is preferable that the insulator 50 have a permittivity (i.e., dielectric constant) of three or more. For example, the insulator 50 can be made of silicon oxide or tantalum oxide. For example, the insulator 50 can be formed by a sputtering technique or a CVD technique.

In the first region 1 of the semiconductor substrate 10, each of the first conductor 40, the insulator 50, and the second conductor 60 is formed not only in the blind hole 20 but also on the front surface 11 between adjacent blind holes 20. Thus, each of the first conductor 40, the insulator 50, and the second conductor 60 continuously extends between adjacent blind holes 20.

In other words, each of the first conductor 40, the insulator 50, and the second conductor 60 extends from the inside of the blind hole 20 to the front surface 11 around the opening of the blind hole 20, extends along the front surface 11, and then enters an adjacent blind hole 20. That is, the sandwich structure, in which the first conductor 40, the insulator 50, and the second conductor 60 are stacked, continuously extends between adjacent blind holes 20 through the front surface 11 of the semiconductor substrate 10.

Although a planar shape of the first conductor 40 viewed from the front surface 11 side of the semiconductor substrate 10 is recessed at the blind hole 20 and the through hole 30, the first conductor 40 is formed as a single continuous layer extending over the front surface 11 of the first region 1 and the second region 2 of the semiconductor substrate 10.

A planar shape of the insulator 50 viewed from the front surface 11 side of the semiconductor substrate 10 follows the planar shape of the first conductor 40 on which the insulator 50 is located. The second conductor 60 extends between the blind hole 20 and the through hole 30 through the front surface 11 of the semiconductor substrate 10. Thus, the second conductor 60 is formed as a single continuous layer extending over the front surface 11 of the first region 1 and the second region 2 of the semiconductor substrate 10 to fill the blind hole 20 and the through hole 30 and to cover a portion of the front surface 11 between adjacent blind holes 20 and a portion of the front surface 11 between the blind hole 20 and the through hole 30.

In this way, the sandwich structure, in which the first conductor 40, the insulator 50, and the second conductor 60 are stacked, continuously extends over the front surface 11 of the semiconductor substrate 10 and the inner surface of each of the blind hole 20 and the through hole 30.

Thus, the sandwich structure continuously extends between all the blind holes 20 to form one capacitor (capacitance section) having a predetermined capacitance.

That is, the first region 1 of the semiconductor substrate 10 is configured as a capacitor section for providing the capacitance that is formed with the sandwich structure including the first and second conductors 40, 60 spaced by the insulator 50.

In the second region 2 of the semiconductor substrate 10, the first conductor 40 is located in the through hole 30 so that an inner surface of the through hole 30 can be covered with the first conductor 40. The second conductor 60 is located inside the first conductor 40 in the through hole 30. The insulator 50 is located between the first conductor 40 and the second conductor 60 in the through hole 30 so that the first conductor 40 and the second conductor 60 can be electrically insulated from each other by the insulator 50. Thus, the sandwich structure formed in the blind hole 20 is also formed in the through hole 30.

Specifically, the first conductor 40 has a tube shape and is located on the inner surface of the through hole 30. The insulator 50 has a tube shape and is located on the inner surface of the first conductor 40 in the through hole 30. The second conductor 60 has a column shape and is located in a hollow of the insulator 50 in the through hole 30 so that the hollow of the insulator 50 can be filled with the second conductor 60. In the through hole 30, each of the first conductor 40, the insulator 50, and the second conductor 60 extends from the front surface 11 to the back surface 12.

The first conductor 40 in the blind hole 20 is electrically connected to the first conductor 40 in the through hole 30. Likewise, the second conductor 60 in the blind hole 20 is electrically connected to the second conductor 60 in the through hole 30. Thus, the first conductor 40 and the second conductor 60 in the blind hole 20 are drawn to both the front surface 11 and the back surface 12 of the semiconductor substrate 10 through the first conductor 40 and the second conductor 60 in the through hole 30.

That is, the second region 2 of the semiconductor substrate 10 is configured as an electrode drawing section for drawing the first conductor 40 and the second conductor 60 of the capacitor section of the first region 1 to both the front surface 11 and the back surface 12 of the semiconductor substrate 10.

According to the first embodiment, the first conductor 40 and the second conductor 60 in the blind hole 20 are electrically connected though the front surface 11 of the semiconductor substrate 10 to the first conductor 40 and the second conductor 60 in the through hole 30.

Specifically, the first conductor 40 and the second conductor 60 in the blind hole 20 are electrically connected though the first conductor 40 and the second conductor 60 on the front surface 11 of the semiconductor substrate 10 between the blind hole 20 and the through hole 30 to the first conductor 40 and the second conductor 60 in the through hole 30. Thus, the first conductor 40 and the second conductor 60 in the blind hole 20 are drawn to both the front surface 11 and the back surface 12 through the first conductor 40 and the second conductor 60 in the through hole 30.

As described above, the second conductor 60 is formed as a single continuous layer extending over the front surface 11 of the semiconductor substrate 10 and the inside of each of the blind hole 20 and the through hole 30. Further, the second conductor 60 extends from the front surface 11 to the back surface 12 by passing the through hole 30. Thus, the second conductor 60 is drawn to not only the front surface 11 but only to the back surface 12.

The second conductor 60 on the front surface 11 of the semiconductor substrate 10 is configured as a front-surface side signal terminal 71. According to the first embodiment, the front-surface side signal terminal 71 electrically connects the second conductor 60 in the blind hole 20 to the second conductor 60 in an adjacent blind hole 20 and also electrically connects the second conductor 60 in the blind hole 20 to the second conductor 60 in the through hole 30.

In FIG. 2, the front-surface side signal terminal 71 is partially illustrated as a semicircle. However, the front-surface side signal terminal 71 as a whole has a circular planar shape over the first region 1 and the second region 2.

Further, as described above, each of the first conductor 40 and the insulator 50 continuously extends between the blind boles 20 and extends from the front surface 11 of the semiconductor substrate 10 between the blind hole 20 and the through hole 30 to the inside of the through hole 30. Each of the first conductor 40 and the insulator 50 extends from the front surface 11 to the back surface 12 by passing the through hole 30. Thus, each of the first conductor 40 and the insulator 50 is drawn to not only the front surface 11 but only to the back surface 12.

A back-surface side connection layer 75 is formed on the back surface 12 of the semiconductor substrate 10. The first conductor 40, which is drawn to the back surface 12 through the through hole 30, is electrically connected to the back-surface side connection layer 75.

The back-surface side connection layer 75 is formed as a single continuous layer extending over the back surface 12 of the first region 1 and the second region 2 of the semiconductor substrate 10. The back-surface side connection layer 75 is in contact with and covers the first conductor 40 in the through hole 30. The back-surface side connection layer 75 has an opening communicating with the through hole 30. A width of the opening of the back-surface side connection layer 75 is less than the width of the opening of the first conductor 40 in the through hole 30 so that the opening of the back-surface side connection layer 75 can be located inside the opening of the first conductor 40 (see FIG. 6).

According to the first embodiment, the back-surface side connection layer 75 is made of the same material as that of the first conductor 40. Alternatively, the back-surface side connection layer 75 can be made of a different material from that of the first conductor 40, as long as the back-surface side connection layer 75 can have almost the same electrical conductivity as the first conductor 40. For example, when the first conductor 40 is made of copper (Cu), the back-surface side connection layer 75 can be made of aluminum (Al).

An insulation cover layer 77 is formed on the back surface 12 side of the semiconductor substrate 10 to cover the back-surface side connection layer 75. Further, the cover layer 77 is joined to the insulator 50 in the through hole 30.

According to the first embodiment, the cover layer 77 is made of the same material as that of the insulator 50. Alternatively, the cover layer 77 can be made of a different material from that of the insulator 50, as long as the cover layer 77 can have almost the same electrical insulation property as the insulator 50.

The cover layer 77 has an opening where the second conductor 60 in the through hole 30 is exposed and an opening where the back-surface side connection layer 75 jointed to a back-surface side ground terminal 82 is exposed. The back-surface side ground terminal 82 is described in detail later.

Further, a back-surface side signal terminal 72 is formed as a single continuous layer on the back surface 12 side of the semiconductor substrate 10. The back-surface side signal terminal 72 is located corresponding to the front-surface side signal terminal 71 and covers the cover layer 77. It is noted that the back-surface side signal terminal 72 is in contact with the second conductor 60 in the through hole 30 through the opening of the cover layer 77. On the back surface 12 of the semiconductor substrate 10, the second conductor 60 in the through hole 30 is electrically connected through the back-surface side signal terminal 72 to the second conductor 60 in an adjacent through hole 30.

The back-surface side signal terminal 72 has almost the same circular planar shape as the front-surface side signal terminal 71 over the first region 1 and the second region 2. The front-surface side signal terminal 71 and the back-surface side signal terminal 72 are electrically connected together through the second conductor 60 in the through hole 30.

The back-surface side ground terminal 82 is located on the back surface 12 of the second region 2 of the semiconductor substrate 10 and separated from the through hole 30. The back-surface side ground terminal 82 has a ring shape and surrounds the back-surface side signal terminal 72.

The back-surface side ground terminal 82 is in contact with and electrically connected to the back-surface side connection layer 75 though the opening of the cover layer 77. In contrast, the back-surface side ground terminal 82 is separated and electrically isolated from the back-surface side signal terminal 72 by the cover layer 77.

A front-surface side ground terminal 81 is formed on the front surface 11 of the second region 2 of the semiconductor substrate 10 and located corresponding to the back-surface side ground terminal 82. The front-surface side ground terminal 81 has almost the same ring shape as the back-surface side ground terminal 82 and surrounds the front-surface side signal terminal 71. It is noted that FIG. 2 illustrates a half of the front-surface side ground terminal 81.

The first conductor 40 and the insulator 50 in the through hole 30 extends to the front surface 11 of the semiconductor substrate 10 and is interposed between the front surface 11 and the front-surface side ground terminal 81.

The front-surface side ground terminal 81 is in contact with and electrically connected to the first conductor 40 through the opening of the insulator 50. In contrast, the front-surface side ground terminal 81 is separated and electrically isolated from the front-surface side signal terminal 71 by the insulator 50.

The semiconductor device according to the first embodiment is summarized below. The first conductor 40 formed in the blind hole 20 of the first region 1, which is configured as a capacitor section, is electrically connected through the front surface 11 to the first conductor 40 formed in the through hole 30 of the second region 2, which is configured as an electrode drawing section.

On the front surface 11 of the semiconductor substrate 10, the first conductor 40 is drawn to the front-surface side ground terminal 81 that is located around the opening of the through hole 30. In contrast, on the back surface 12 of the semiconductor substrate 10, the first conductor 40 is drawn to the back-surface side ground terminal 82 through the back-surface side connection layer 75.

On the other hand, the second conductor 60 formed in the blind hole 20 of the first region 1, which is configured as a capacitor section, is electrically connected through the front surface 11 to the second conductor 60 formed in the through hole 30 of the second region 2, which is configured as an electrode drawing section.

On the front surface 11 of the semiconductor substrate 10, the second conductor 60 is drawn to the front-surface side signal terminal 71 that is located on the through hole 30. In contrast, on the back surface 12 of the semiconductor substrate 10, the second conductor 60 is drawn to the back-surface side signal terminal 72.

Thus, the first conductor 40 in the blind hole 20 is drawn to each of the front surface 11 and the back surface 12 through the first conductor 40 in the through hole 30 and connected to each of the front-surface side ground terminal 81 and the back-surface side ground terminal 82. Likewise, the second conductor 60 in the blind hole 20 is drawn to each of the front surface 11 and the back surface 12 through the second conductor 60 in the through hole 30 and connected to each of the front-surface side signal terminal 71 and the back-surface side signal terminal 72.

The first and second conductors 40, 60 drawn to the front and back surfaces 11, 12 can be connected to another device through the signal terminals 71, 72 and the ground terminals 81, 82.

For example, the signal terminals 71, 72 and the ground terminals 81, 82 can be electrically connected to a semiconductor element (not shown) formed in the semiconductor substrate 10, an electrical component mounded on the semiconductor substrate 10, or a terminal of an external substrate.

According to the first embodiment, as shown in FIG. 1, the front-surface side signal terminal 71 is configured as a signal input terminal, and the back-surface side signal terminal 72 is configured as a signal output terminal. When a signal containing noise is inputted to the front-surface side signal terminal 71, the noise flows to the ground terminals 81, 82 through a capacitor formed between the signal terminal and the ground terminal. Thus, the amount of noise contained in the signal outputted from the back-surface side signal terminal 72 is less than the amount of noise contained in the signal inputted to the front-surface side signal terminal 71.

By the way, according to the first embodiment, the second region 2 of the semiconductor substrate 10 is configured as an electrode drawing section for drawing the first conductor 40 and the second conductor 60 of the capacitor section to both the front surface 11 and the back surface 12 of the semiconductor substrate 10.

In the first region 1 for providing the capacitance section, a group of the blind holes 20 is formed, and the first and second conductors 40, 60 spaced by the insulator 50 are located in each blind hole 20. The first and second conductors 40, 60 in all of the blind holes 20 are connected so that the area between the first and second conductors 40, 60 can be increased. Thus, the capacitance of the capacitor section can be increased.

Further, since the width of each blind hole 20 is smaller than the width of the through hole 30, an increase in size of the capacitance section can be reduced as much as possible. Further, since the blind holes 20 are located close to each other, the effect of parasitic inductance and resistance component due to the wiring drawing can be reduced as much as possible. Thus, the capacitance section can effectively remove high-frequency noise.

Next, a method of manufacturing the semiconductor device according to the first embodiment is described below with further reference to FIGS. 3A-3C, FIGS. 4A-4C, FIGS. 5A and 5B, FIG. 6, and FIGS. 7A and 7B.

Firstly, the semiconductor substrate 10 having the front surface 11 and the back surface 12 is prepared. Then, in a first process shown in FIG. 3A, first holes 21 and second holes 31 are formed in the front surface 11 of the semiconductor substrate 10. A depth of each second hole 31 is greater than a depth of each first hole 21 measured from the front surface 11. It is noted that the depths of the first hole 21 and the second hole 31 are less than a thickness of the semiconductor substrate 10. That is, each of the first hole 21 and the second hole 31 is a blind hole.

The first hole 21 and the second hole 31 are formed at the same time by a dry etching technique by setting a width of the first hole 21 less than a width of the second hole 31. According to the first embodiment, the first hole 21 and the second hole 31 are circular and formed at the same time by a dry etching technique by setting a diameter of the first hole 21 less than a diameter of the second hole 31. In such an approach, the depth of the second hole 31 can become greater than the depth of the first hole 21.

The diameter of the first hole 21 can be easily set less than the diameter of the second hole 31 by using an etching mask in which a diameter of a first opening for the first hole 21 is less than a diameter of a second opening for the second hole 31. The etching mask having the first opening and the second opening can be formed by a photolithography technique, for example. When the first hole 21 and the second hole 31 are formed at the same time by a dry etching technique using the etching mask having the first opening and the second opening, the depth of the second hole 31 becomes greater than the depth of the first hole 21.

Specifically, since the first opening for the first hole 21 is less than the second opening for the second hole 31, an etching rate at which the first hole 21 is etched in the semiconductor substrate 10 is less than an etching rate at which the second hole 31 is etched in the semiconductor substrate 10. Therefore, when the first hole 21 and the second hole 31 are formed at the same time by a dry etching technique using the etching mask having the first opening and the second opening, the depth of the second hole 31 becomes greater than the depth of the first hole 21. For example, the dry etching technique can use sulfur hexafluoride ($SF_6$) gas.

Figure 3A:
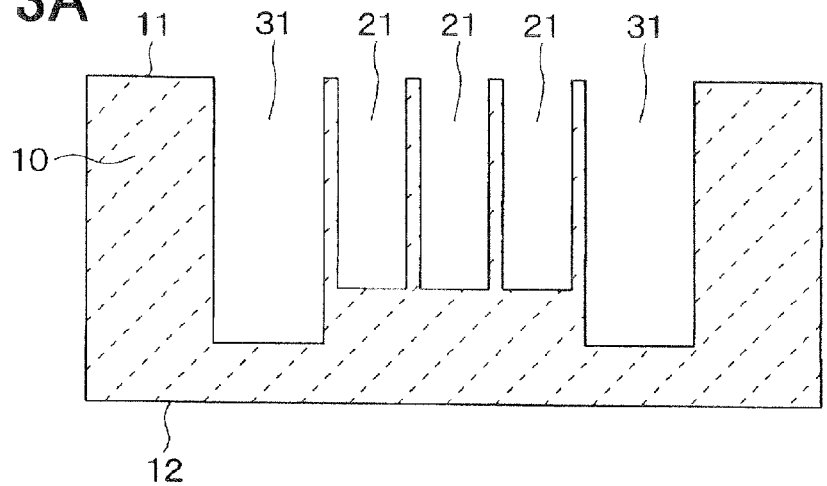
FIGS. 3A-3C are diagrams illustrating processes of manufacturing the semiconductor device according to the first embodiment.
Figure 3B:
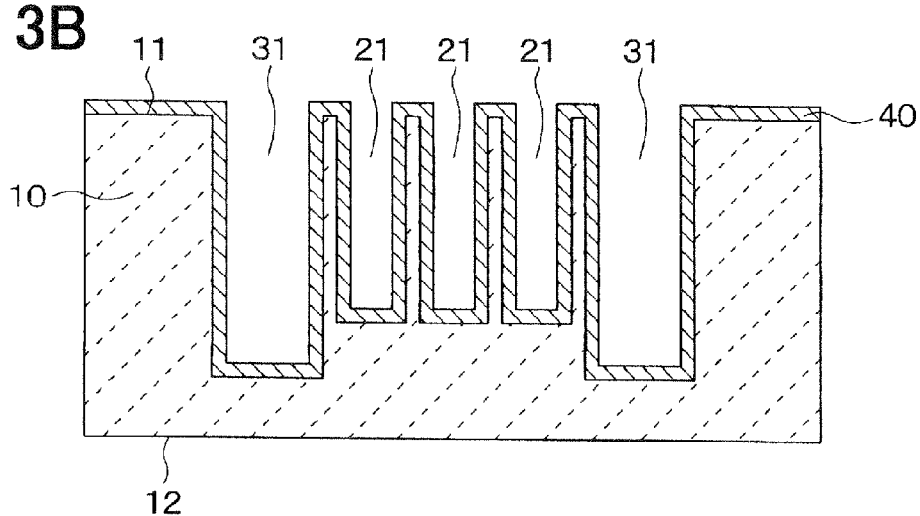

Then, in a second process shown in FIG. 3B, the first conductor 40 is formed on the semiconductor substrate 10 from the front surface 11 side. As a result, the first conductor 40 is formed on an inner surface of each first hole 21, on an inner surface of each second hole 31, on a portion of the front surface 11 between adjacent first holes 21, and on a portion of the front surface 11 between the first hole 21 and the second hole 31.

Thus, in the second process, the first conductor 40 is formed as a single continuous layer extending over the front surface 11 to follow the shapes of the first hole 21 and the second hole 31. That is, the first conductor 40 has a tube shape with a bottom in each of the first hole 21 and the second hole 22. For example, the first conductor 40 can be formed by a sputtering technique, a CVD technique, or a plating technique by using Cu, Al, or W.

Figure 3C:
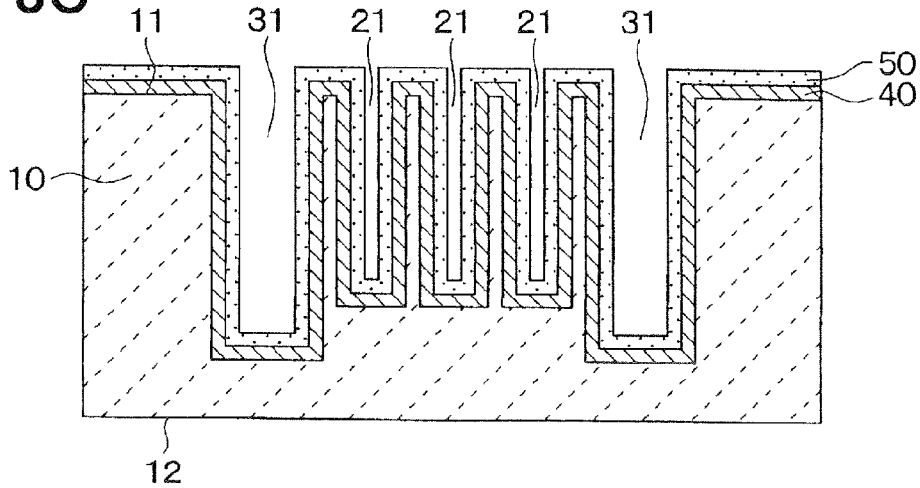

Next, in a third process shown in FIG. 3C, the insulator 50 is formed on the semiconductor substrate 10 from the front surface 11 side. As a result, the insulator 50 is formed on the first conductor 40.

Specifically, the insulator 50 is formed on the first conductor 40 in each first hole 21, on the first conductor 40 in each second hole 31, on the first conductor 40 on the portion of the front surface 11 between adjacent first holes 21, and on the first conductor 40 on the portion of the front surface 11 between the first hole 21 and the second hole 31.

Thus, in the third process, the insulator 50 is formed as a single continuous layer extending over the first conductor 40 to follow the shape of the first conductor 40. That is, the insulator 50 has a tube shape with a bottom in each of the first hole 21 and the second hole 22. For example, the insulator 50 can be formed by a sputtering technique or a CVD technique by using silicon oxide or tantalum oxide.

Figure 4A:
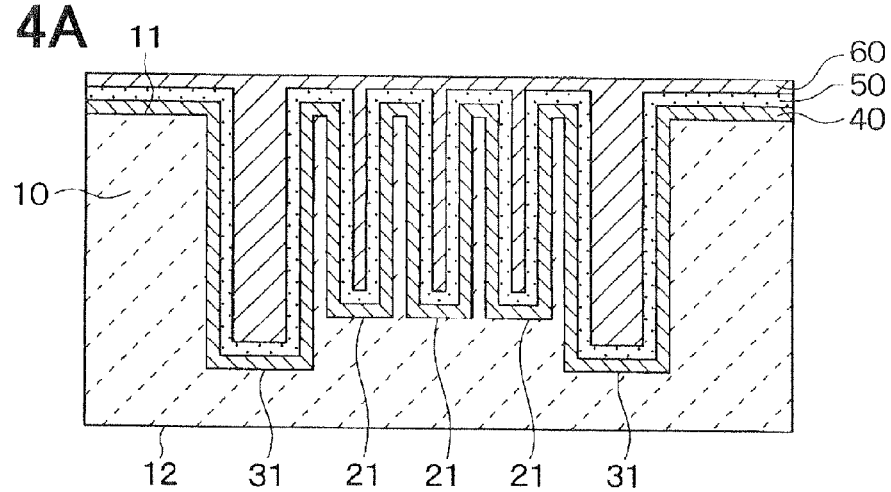
FIGS. 4A-4C are diagrams illustrating processes following the processes of FIGS. 3A-3C.

Then, in a fourth process shown in FIG. 4A, the second conductor 60 is formed on the semiconductor substrate 10 from the front surface 11 side. As a result, the second conductor 60 is formed on the insulator 50 so that a hollow of the tube-shaped insulator 50 in each of the first hole 21 and the second hole 31 can be filled with the second conductor 60.

Specifically, the second conductor 60 is formed on the insulator 50 in each first hole 21, on the insulator 50 in each second hole 31, on the insulator 50 on the portion of the front surface 11 between adjacent first holes 21, and on the insulator 50 on the portion of the front surface 11 between the first hole 21 and the second hole 31.

Thus, in the fourth process, the second conductor 60 is formed as a single continuous layer extending over the insulator 50 to fill the first hole 21 and the second hole 31. For example, the second conductor 60 can be formed by a sputtering technique, a CVD technique, or a plating technique by using Cu, Al, or W.

Figure 4B:
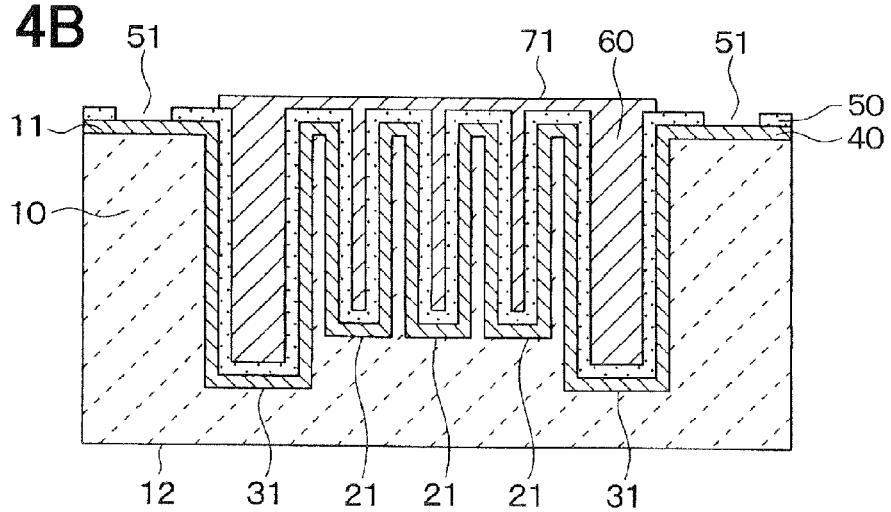

Then, as shown in FIG. 4B, the front-surface side signal terminal 71 is formed by patterning the second conductor 60 on the front surface 11 by a photolithography technique or the like.

Further, an opening 51 is formed in the insulator 50 by patterning the insulator 50 exposed to the front surface 11 around the front-surface side signal terminal 71 by a photolithography technique or the like. As a result, the first conductor 40 is exposed through the opening 51. Like the front-surface side ground terminal 81, which is formed on the opening 51 in a next process, the opening 51 can have a continuous ring shape. Alternatively, the opening 51 can have portions that are arranged at intervals in a ring shape.

Figure 4C:
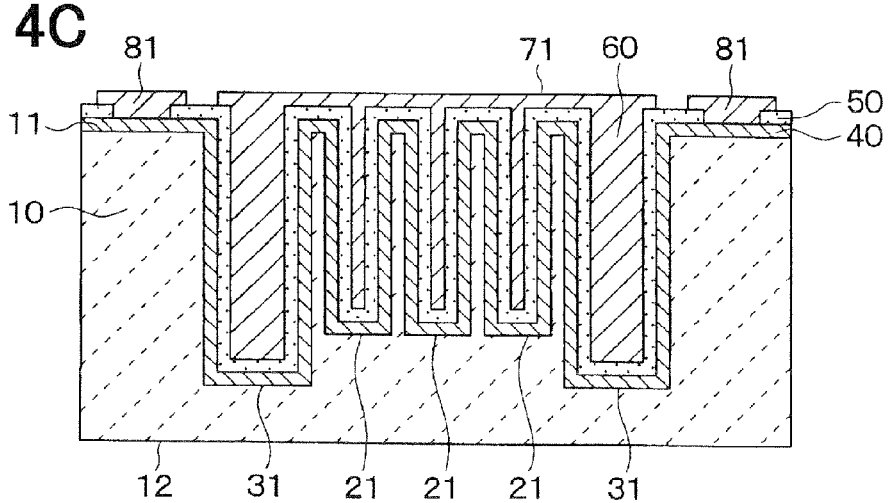

Then, as shown in FIG. 4C, the front-surface side ground terminal 81 is formed on the opening 51 of the insulator 50 by the same technique as the first conductor 40 and by using the same material as the first conductor 40. As a result, the front-surface side ground terminal 81 and the first conductor 40 are electrically connected together through the opening 51.

Figure 5A:
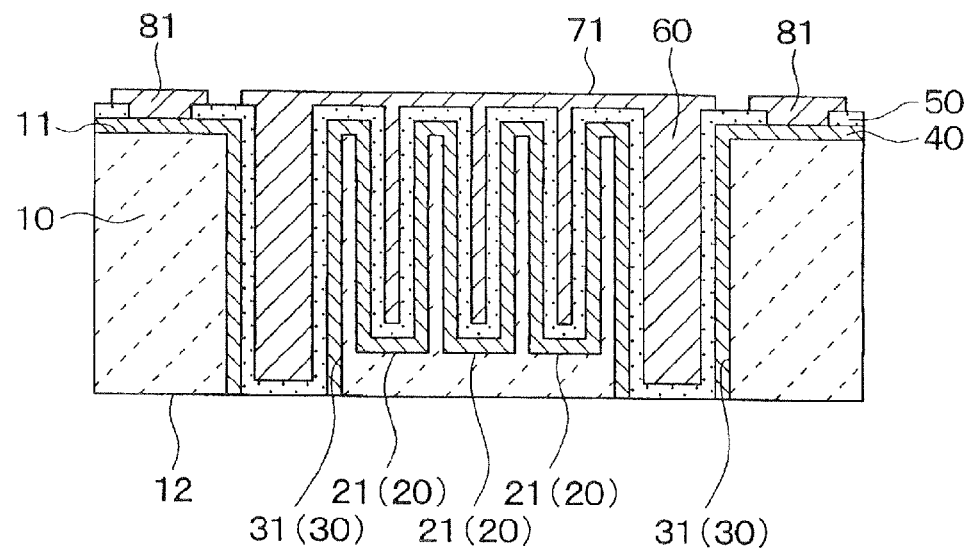
FIGS. 5A and 5B are diagrams illustrating processes following the processes of FIGS. 4A-4C.

Next, in a fifth process shown in FIG. 5A, the semiconductor substrate 10 is thinned from the back surface 12 side until the first conductor 40 and the insulator 50 in the second hole 31 are exposed to the back surface 12.

For example, the semiconductor substrate 10 can be thinned by polishing the back surface 12 side of the semiconductor substrate by a chemical mechanical polishing (CMP) technique.

As a result of the fifth process, the first hole 21 is formed into the blind hole 20, and the second hole 31 is formed into the through hole 30. The first conductor 40 and the insulator 50 in the through hole 30 are exposed to the back surface 12 of the semiconductor substrate 10. In contrast, the second conductor 60 in the through hole 30 remains covered with the insulator 50 on the back surface 12 side and thus is not exposed to the back surface 12 side.

Figure 5B:
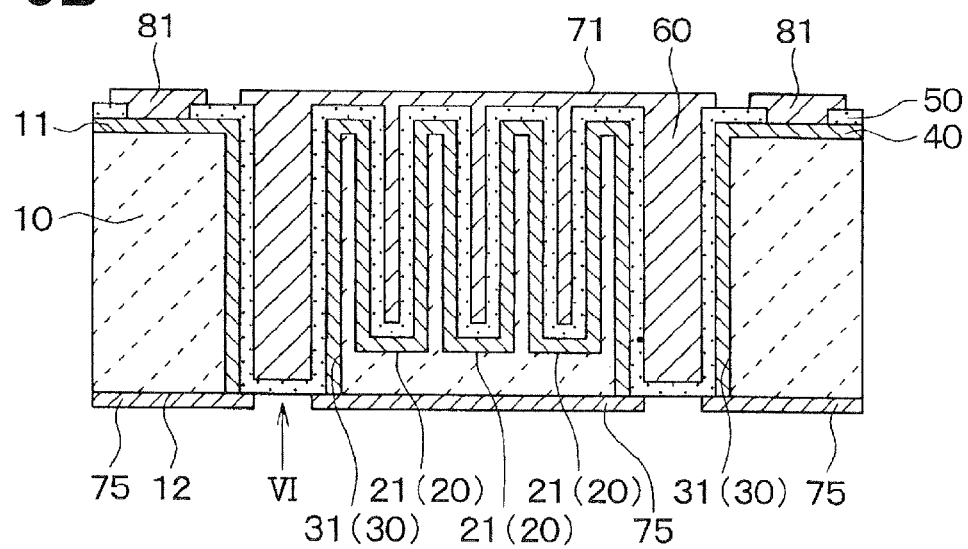

Then, as shown in FIG. 5B, the back-surface side connection layer 75 is formed on the back surface 12 of the semiconductor substrate 10 by the same technique as the second conductor 60 and by using the same material as the second conductor 60.

Figure 6:
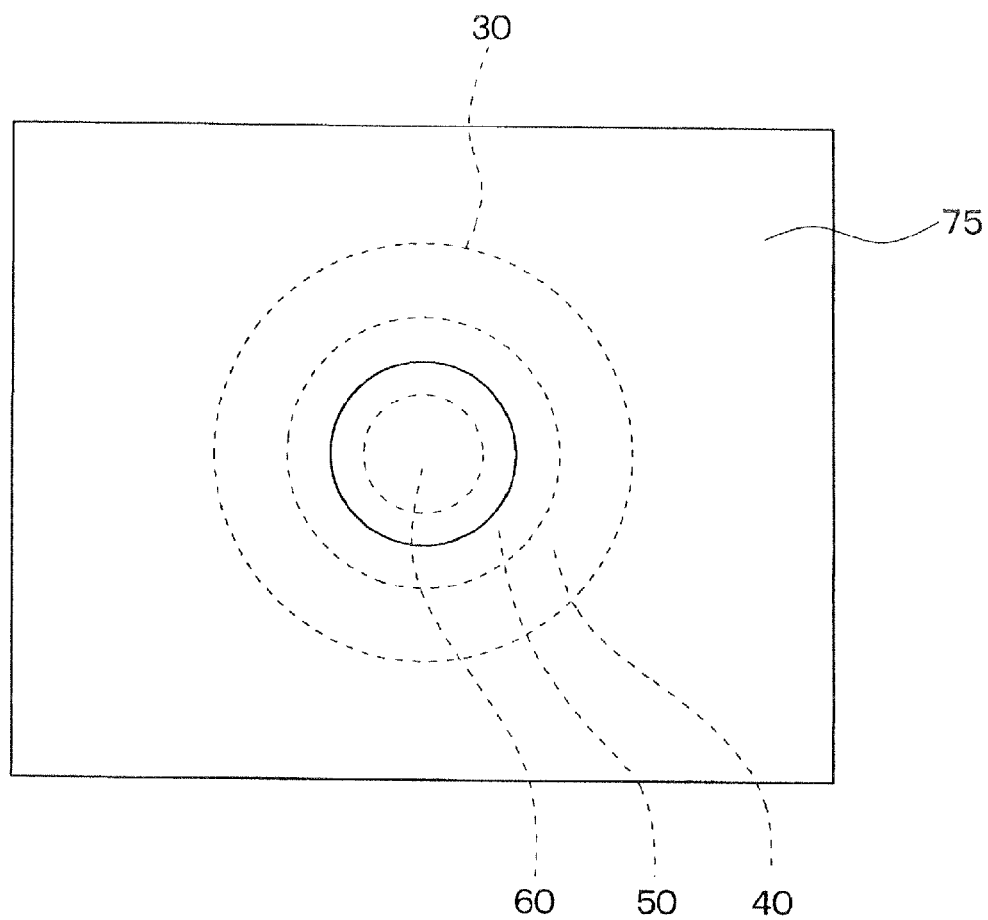
FIG. 6 is a diagram illustrating a partial plan view from a direction indicated by an arrow VI in FIG. 5B.

Specifically, as shown in detail in FIG. 6, on the back surface 12 of the semiconductor substrate 10, the insulator 50 in the through hole 30 is exposed outside the back-surface side connection layer 75, and the first conductor 40 in the through hole 30 is in contact with and electrically connected to the back-surface side connection layer 75.

Figure 7A:
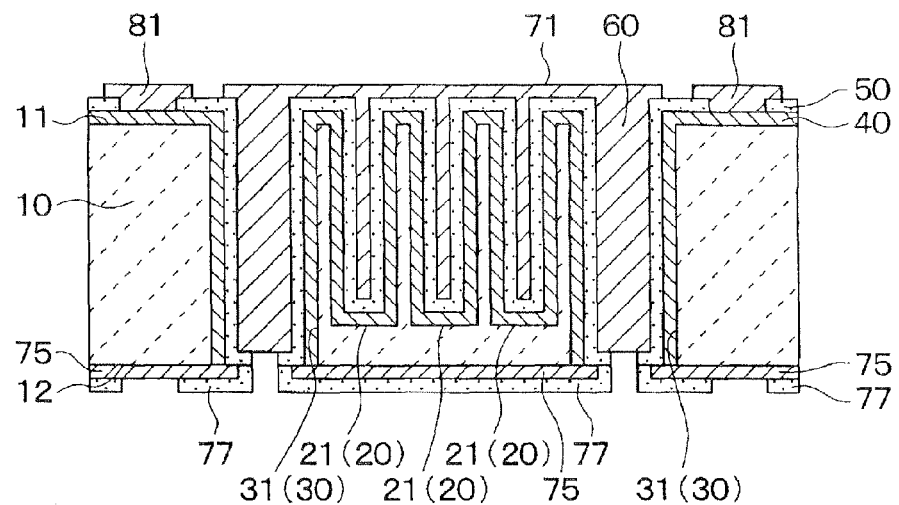
FIGS. 7A and 7B are diagrams illustrating processes following the processes of FIGS. 5A and 5B.

Then, as shown in FIG. 7A, the cover layer 77 is formed on the back surface 12 of the semiconductor substrate 10 by the same technique as the insulator 50 and by using the same material as the insulator 50.

Specifically, the cover layer 77 is formed over the entire back surface 12 of the first region 1 and the second region 2 of the semiconductor substrate 10 and then patterned so that the insulator 50 in the through hole 30 and a portion of the first conductor 40 to be connected to the back-surface side ground terminal 82 can be exposed outside the cover layer 77.

Further, as a sixth process, the insulator 50, which is located in the through hole 30 and exposed outside the cover layer 77, is removed at the same time as the cover layer 77 is patterned. As a result, the second conductor 60 in the through hole 30 can be exposed outside the cover layer 77.

Figure 7B:
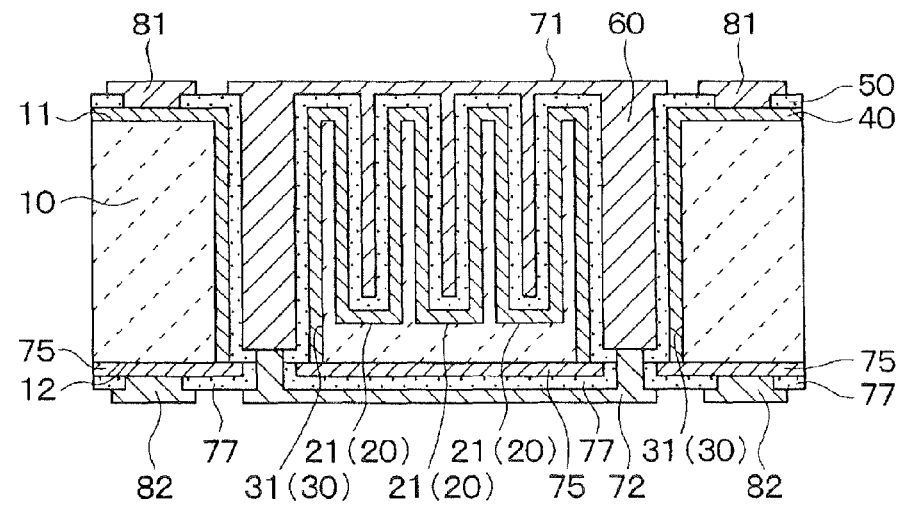

Next, as shown in FIG. 7B, the back-surface side signal terminal 72 is formed by a photolithography technique or the like by using the same material as the second conductor 60, and the back-surface side ground terminal 82 is formed by a photolithography technique or the like by using the same material as the first conductor 40. In this way, the semiconductor device according to the first embodiment is manufactured.

As described above, according to the first embodiment, the first hole 21 and the second hole 31 are formed at the same time by a dry etching technique by setting the width of the first hole 21 less than the width of the second hole 31. In such an approach, the depth of the first hole 21 can be smaller than the depth of the second hole 31.

Alternatively, the first hole 21 and the second hole 31 can be separately formed. In such an approach, the depth of the first hole 21 can be smaller than the depth of the second hole 31 without setting the width of the first hole 21 less than the width of the second hole 31.

(Second Embodiment)

Figure 8:
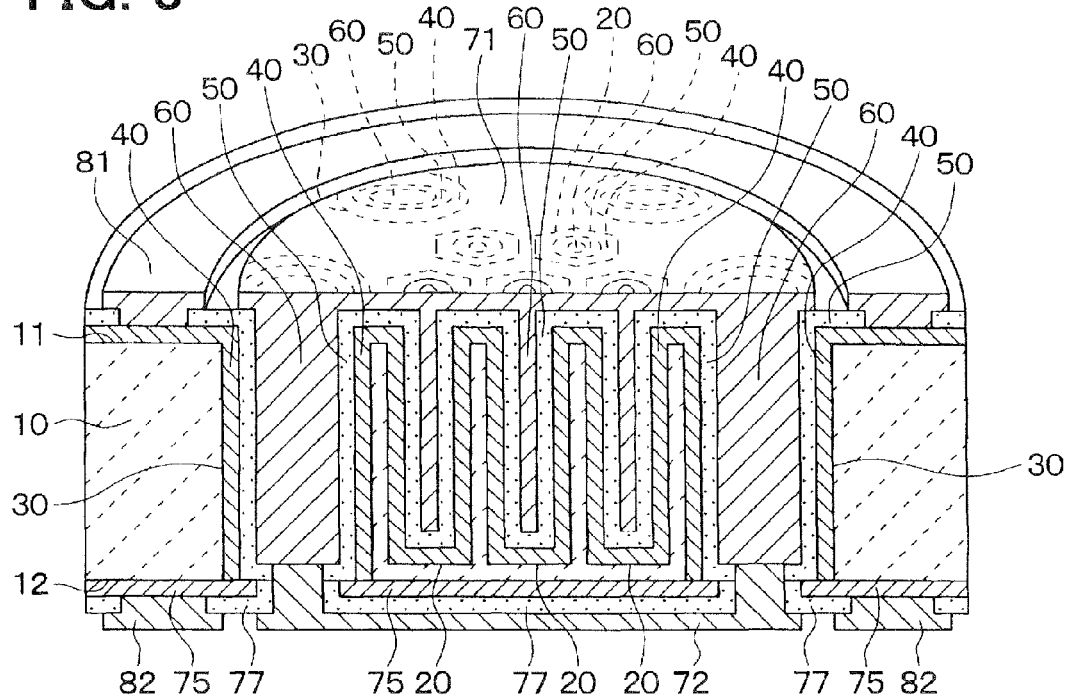
FIG. 8 is a diagram illustrating a cross-sectional perspective view of a semiconductor device according to a second embodiment of the present invention.

A semiconductor device according to a second embodiment of the present invention is described below with reference to FIG. 8. FIG. 8 is a diagram illustrating a cross-sectional perspective view of the semiconductor device. A difference between the first embodiment and the second embodiment is the shape of the blind hole 20.

As shown in FIG. 8, according to the second embodiment, each blind hole 20 has a hexagonal shape. The blind holes 20 are grouped and arranged to form a honeycomb structure. Thus, a group of the blind holes 20 has a honeycomb structure.

Like the first embodiment, the width of each blind hole 20 is less than the width of each through hole 30. According to the second embodiment, the maximum width of the blind hole 20 (i.e., the length of a diagonal of the hexagonal shape) is less than the diameter of the through hole 30.

As described above, according to the second embodiment, the blind holes 20 are arranged to form a honeycomb structure. In such an approach, the area of the semiconductor substrate 10 occupied by the blind holes 20 can be reduced so that a decrease in a mechanical strength of the semiconductor substrate 10 can be reduced. Like the first embodiment, since the width of the blind hole 20 is less than the width of the through hole 30, the blind hole 20 and the through hole 30 can be easily formed by using the fact that the etching rate increases with an increase in the hole width.

The semiconductor device according to the second embodiment can be manufactured in the same method as the semiconductor device according to the first embodiment except that the first hole 21 is formed into a hexagonal shape.

(Third Embodiment)

Figure 9:
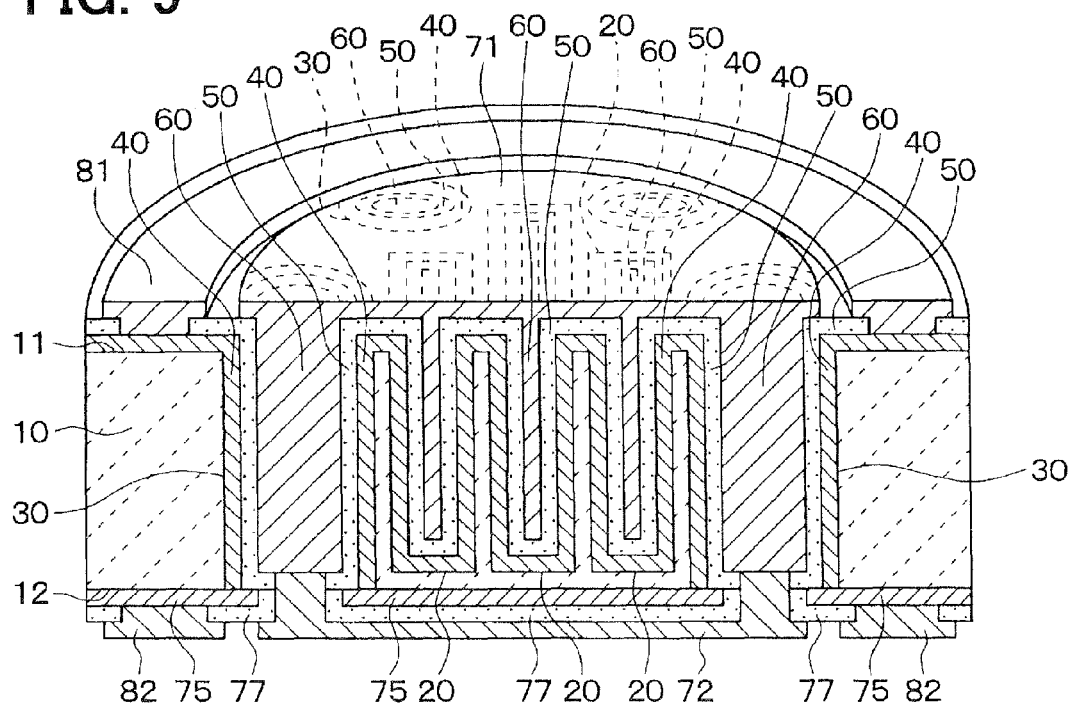
FIG. 9 is a diagram illustrating a cross-sectional perspective view of a semiconductor device according to a third embodiment of the present invention.

A semiconductor device according to a third embodiment of the present invention is described below with reference to FIG. 9. FIG. 9 is a diagram illustrating a cross-sectional perspective view of the semiconductor device. A difference between the first embodiment and the third embodiment is the shape of the blind hole 20.

As shown in FIG. 9, according to the third embodiment, each blind hole 20 has a rectangular shape such as a trench. Like the first embodiment, the width of each blind hole 20 is less than the width of each through hole 30. Specifically, the length of the shorter side of the rectangular blind hole 20 is less than the diameter of the through hole 30. Therefore, like the first embodiment, the blind hole 20 and the through hole 30 can be easily formed by using the fact that the etching rate increases with an increase in the hole width.

The semiconductor device according to the third embodiment can be manufactured in the same method as the semiconductor device according to the first embodiment except that the first hole 21 is formed into a rectangular shape.

(Fourth Embodiment)

Figure 10:
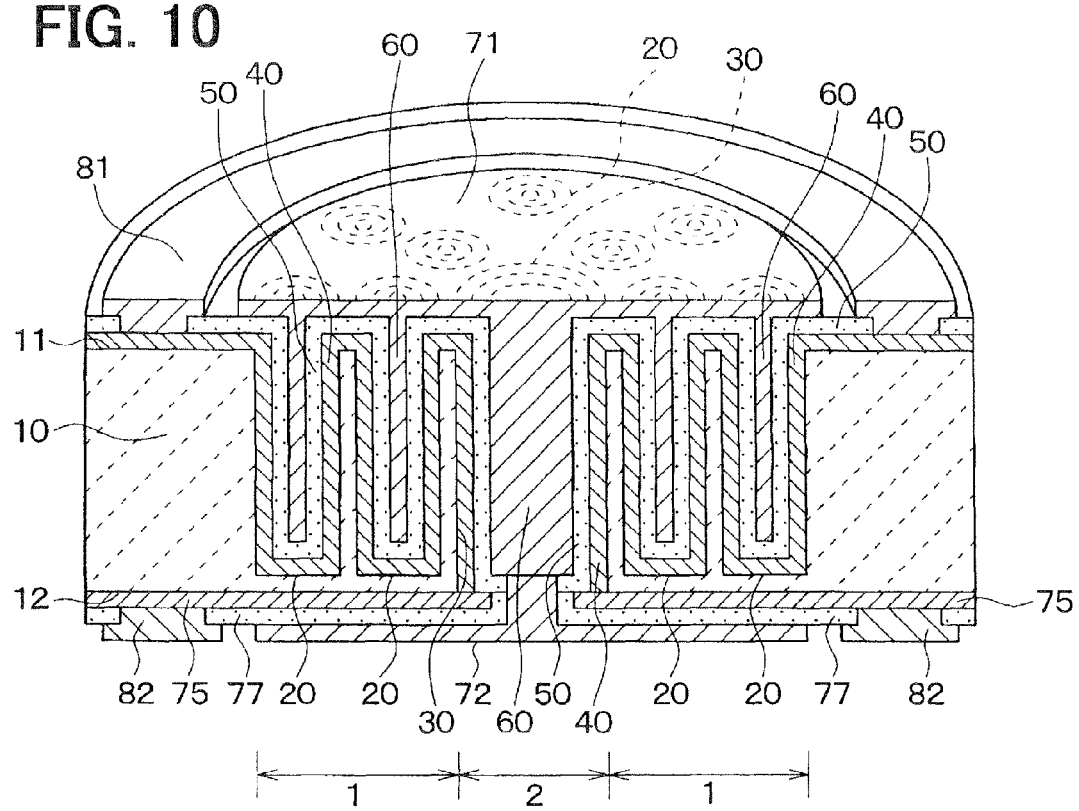
FIG. 10 is a diagram illustrating a cross-sectional perspective view of a semiconductor device according to a fourth embodiment of the present invention.

A semiconductor device according to fourth embodiment of the present invention is described below with reference to FIG. 10. FIG. 10 is a diagram illustrating a cross-sectional perspective view of the semiconductor device. A difference between the first embodiment and the fourth embodiment is as follows.

In the first embodiment, as shown in FIG. 1, the second region 2 is located around the first region 1 so that the first region 1 can be surrounded by the second region 2. In contrast, in the fourth embodiment, as shown in FIG. 10, the first region 1 is located around the second region 2 so that the second region 2 can be surrounded by the first region 1.

That is, the first region 1, where the blind holes 20 are formed, is located outside the second region 2, where the through holes 30 are formed. The first and second conductors 40, 60 in the blind hole 20 and the through hole 30 are configured in the same manner as the first embodiment.

That is, the first conductor 40 in the blind hole 20 is drawn to the surface-side ground terminal 81 on the front surface 11 of the semiconductor substrate 10 and electrically connected through the front surface 11 to the first conductor 40 in the through hole 30. The first conductor 40 in the through hole 30 is drawn through the back-surface side connection layer 75 on the back surface 12 to the back-surface side ground terminal 82.

The second conductor 60 in the blind hole 20 is drawn to the front surface-side ground terminal 71 on the front surface 11 of the semiconductor substrate 10 and electrically connected through the front surface 11 to the second conductor 60 in the through hole 30. The second conductor 60 in the through hole 30 is drawn to the back-surface side signal terminal 72 on the back surface 12.

Thus, according to the fourth embodiment, the first conductor 40 in the blind hole 20 is drawn to each of the front surface 11 and the back surface 12 through the first conductor 40 in the through hole 30 and connected to each of the front-surface side ground terminal 81 and the back-surface side ground terminal 82. Likewise, the second conductor 60 in the blind hole 20 is drawn to each of the front surface 11 and the back surface 12 through the second conductor 60 in the through hole 30 and connected to each of the front-surface side signal terminal 71 and the back-surface side signal terminal 72.

The semiconductor device according to the fourth embodiment can be manufactured in the same method as the semiconductor device according to the first embodiment except that a relative position between the first hole 21 and the second hole 31 is reversed.

In an example shown in FIG. 10, the blind hole 20 is circular. The blind hole 20 can have a shape other than a circular shape. For example, the blind hole 20 can have a hexagonal shape of the second embodiment or a rectangular shape of the third embodiment.

(Fifth Embodiment)

Figure 11:
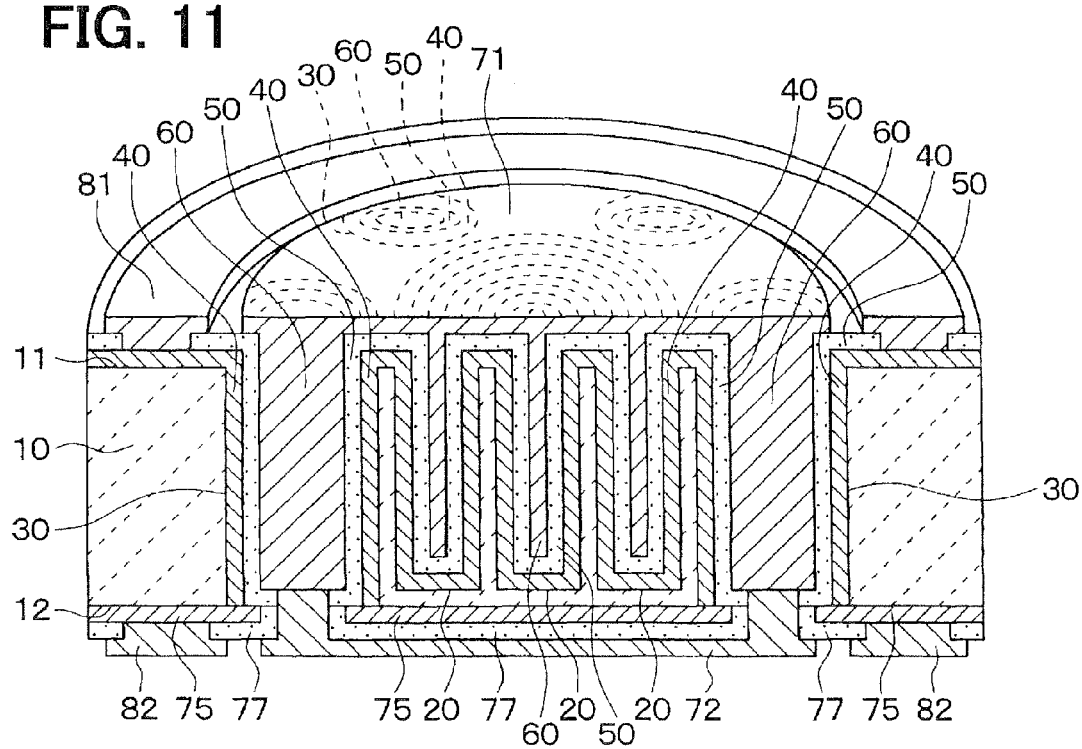
FIG. 11 is a diagram illustrating a cross-sectional perspective view of a semiconductor device according to a fifth embodiment of the present invention.

A semiconductor device according to a fifth embodiment of the present invention is described below with reference to FIG. 11. FIG. 11 is a diagram illustrating a cross-sectional perspective view of the semiconductor device. A difference between the first embodiment and the fifth embodiment is the shape of the blind hole 20.

In the first embodiment, as shown in FIG. 2, the blind holes 20 are independently arranged in the first region 1 of the semiconductor substrate 10 without overlapping each other.

In contrast, in the fifth embodiment, as shown in FIG. 11, the blind holes 20 are arranged in a concentric pattern. One blind hole 20 is located in the center of the concentric pattern, and the other blind holes 20 are located around the center blind hole 20.

In an example shown in FIG. 11, the center blind hole 20 has a circular shape. Alternatively, the center blind hole 20 can have a ring shape. Each of the other blind holes 20 located around the center blind hole 20 has a ring shape, and the other blind holes 20 are arranged with one inside the other. The width of each blind hole 20 is less than the width of the through hole 30.

Like the first embodiment, in each blind hole 20, the first conductor 40, the insulator 50, and the second conductor 60 are stacked in this order from the inner surface of the blind hole 20 to the center of the blind hole 20 to form a sandwich structure.

The sandwich structure continuously extends between all the blind holes 20 through the front surface 11 of the semiconductor substrate 10 to form the capacitance section.

As described above, according to the fifth embodiment, the blind holes 20 are arranged in a concentric pattern like the annual rings of a tree trunk. In such an approach, the area between the first and second conductors 40, 60 can be increased. Thus, the capacitance of the capacitor section can be increased.

Figure 12:
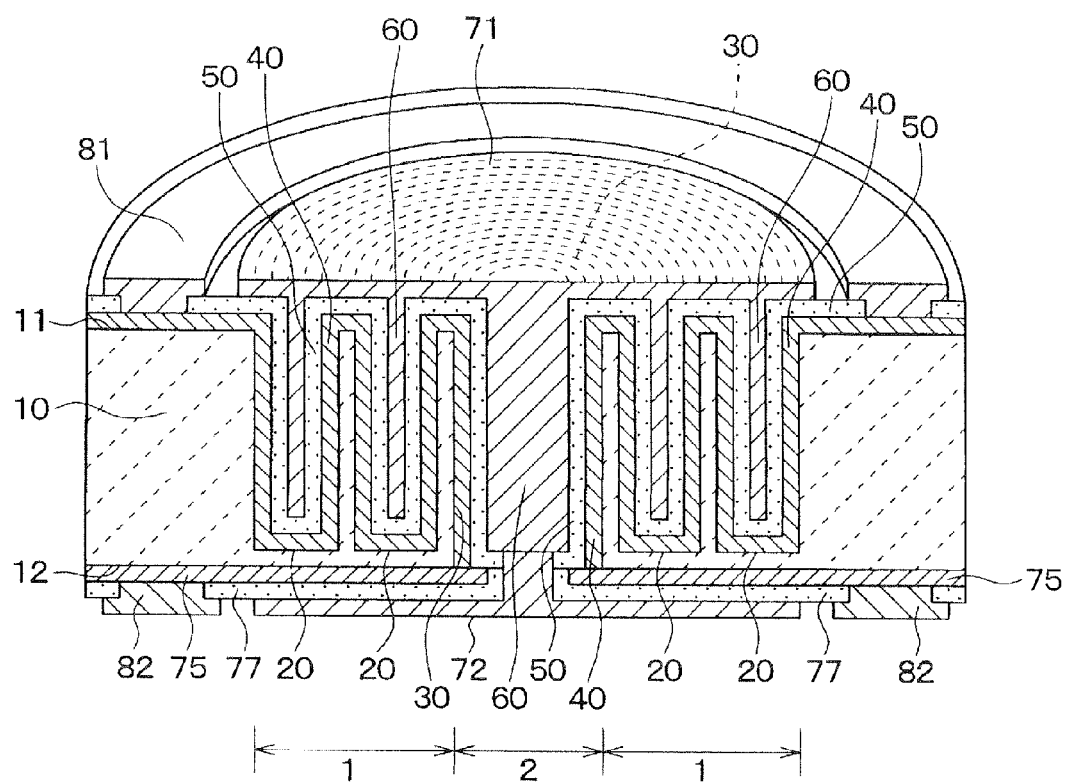
FIG. 12 is a diagram illustrating a cross-sectional perspective view of a semiconductor device according to a modification of the fifth embodiment.

FIG. 12 illustrates a semiconductor device according to a modification of the fifth embodiment. FIG. 11 is a diagram illustrating a cross-sectional perspective view of the semiconductor device.

Like the fourth embodiment, according to the modification of the fifth embodiment, the first region 1, where the blind holes 20 are formed, is located outside the second region 2, where the through holes 30 are formed.

In an example shown in FIG. 12, each blind hole 20 has a ring shape, and the through hole 30 has a circular shape. The blind holes 20 and the through hole 30 are arranged in a concentric pattern in such a manner that the through hole 30 is located in the center of the concentric pattern and that the blind holes 20 are located around the through hole 30 with one inside the other.

The semiconductor device according to the fifth embodiment can be manufactured in the same method as the semiconductor device according to the first embodiment except the arrangement and shape of the first hole 21.

(Sixth Embodiment)

Figure 13:
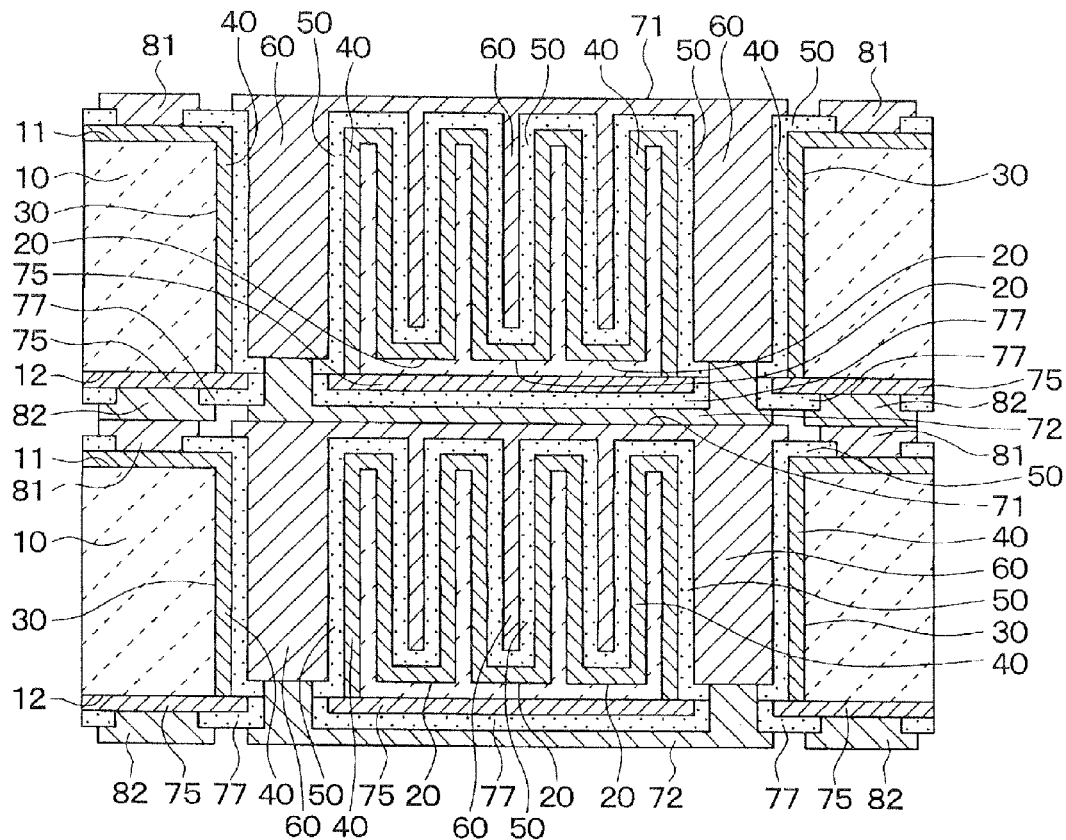
FIG. 13 is a diagram illustrating a cross-sectional perspective view of a semiconductor device according to a sixth embodiment of the present invention.

A semiconductor device according to a sixth embodiment of the present invention is described below with reference to FIG. 13. FIG. 13 is a diagram illustrating a cross-sectional view of the semiconductor device. The semiconductor device shown in FIG. 13 is formed by stacking two semiconductor devices, each of which is shown in FIG. 1, on top of each other.

Specifically, the back-surface side signal terminal 72 and the back-surface side ground terminal 82 of one semiconductor device are electrically connected to the front-surface side signal terminal 71 and the surface-side ground terminal 81 of the other semiconductor device, respectively. In such an approach, the capacitance of the capacitance section can be increased. It is noted that three or more semiconductor devices can be stacked.

(Seventh Embodiment)

Figure 14:
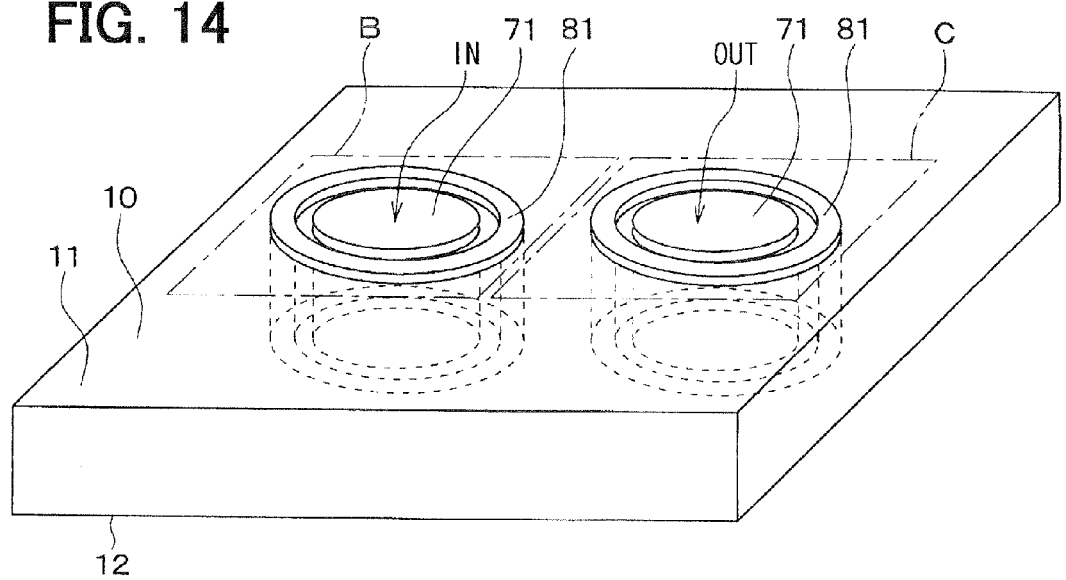
FIG. 14 is a diagram illustrating a perspective view of a semiconductor device according to a seventh embodiment of the present invention.
Figure 15:
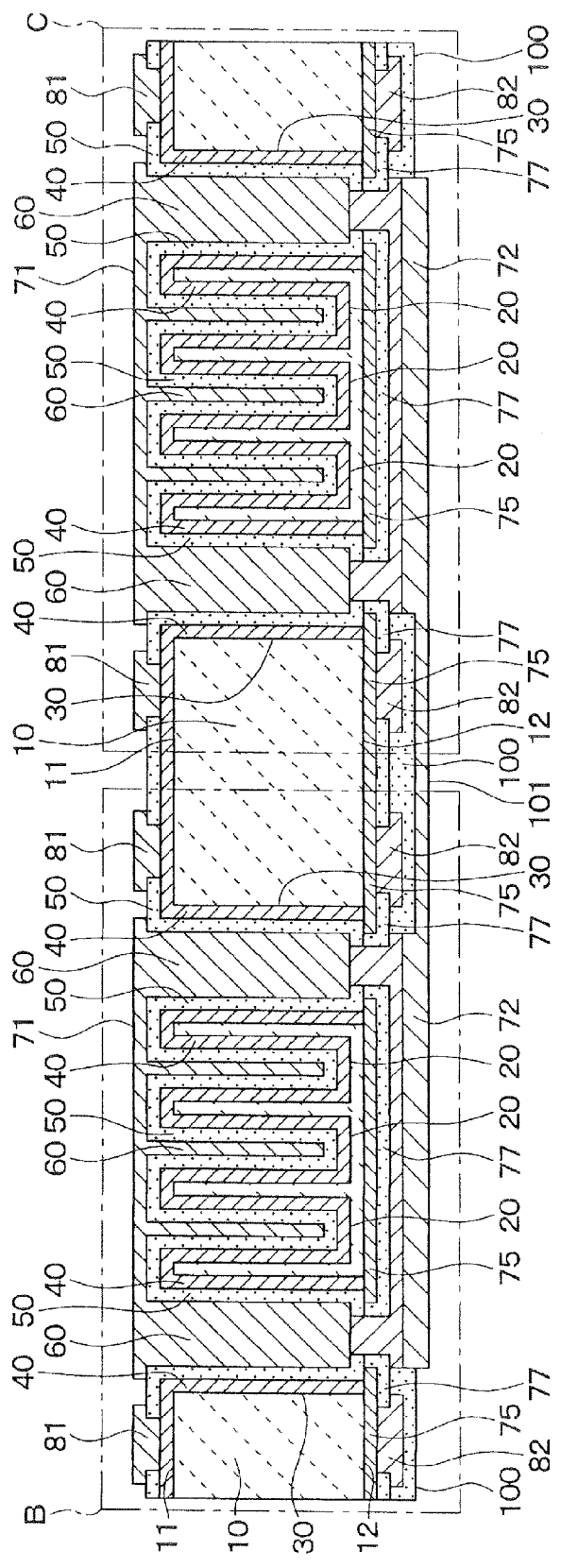
FIG. 15 is a diagram illustrating a cross-sectional view of the semiconductor device according to the seventh embodiment.

A semiconductor device according to a seventh embodiment of the present invention is described below with reference to FIGS. 14 and 15. As can be seen from FIGS. 14 and 15, two electrode portions B, C are formed in a single semiconductor substrate 10.

The first electrode portion B is configured as a signal input electrode, and the second electrode portion C is configured as a signal output electrode. As shown in FIG. 15, each of the first electrode portion B and the second electrode portion C is configured in almost the same manner as the electrode portion of the first embodiment. According to the seventh embodiment, the semiconductor device further has an insulation securing film 100 and an electrode connection film 101 on the back surface 12 side of the semiconductor substrate 10.

Like the insulator 50, the insulation securing film 100 is made of silicon oxide and covers the back-surface side ground terminal 82.

The electrode connection film 101 is made of metal. For example, the electrode connection film 101 can be made of the same metal as the first and second conductors 40, 60. The electrode connection film 101 connects the back-surface side signal terminal 72 of the first electrode portion B to the back-surface side signal terminal 72 of the second electrode portion C. The electrode connection film 101 is electrically insulated by the insulation securing film 100 from the back-surface side ground terminal 82 of each of the first electrode portion B and the second electrode portion C.

As described above, according to the seventh embodiment, the back-surface side signal terminals 72 of the first electrode portion B and the second electrode portion C are electrically connected together by the electrode connection film 101. In such an approach, connection is performed on only the first surface 11 of the semiconductor substrate 10. Thus, there is no need to draw the electrode to the back surface 12 of the semiconductor substrate 10. Specifically, the signal inputted to the front-surface side signal terminal 71 of the first electrode portion B is outputted from the front-surface side signal terminal 71 of the second electrode portion C.

(Modifications)

The embodiments described above can be modified in various ways, for example, as follows.

In the embodiments, the sandwich structure extending between the blind holes 20, between the blind hole 20 and the through hole 30, and between the through holes 30 has a sheet shape. The sandwich structure can have a shape other than a sheet shape. For example, the sandwich structure can have a line (i.e., strip) shape.

In the embodiments, the back-surface side connection layer 75 extending between the through holes 30 has a sheet shape. The back-surface side connection layer 75 can have a shape other than a sheet shape. For example, the back-surface side connection layer 75 can have a line (i.e., strip) shape.

That is, the shapes of the conductors, the insulator, the layers on the front surface 11 and the back surface 12 of the semiconductor substrate 10 is not limited to those of the embodiments.

In the embodiments, the first and second conductors 40, 60 extend between the blind hole 20 and the through hole 30 through the front surface 11 of the semiconductor substrate 10. Alternatively, the first and second conductors 40, 60 extend between the blind hole 20 and the through hole 30 inside the semiconductor substrate 10. For example, the semiconductor substrate 10 can have a communication hole that is located inside the semiconductor substrate 10 and extends between the blind hole 20 and the through hole 30. In this case, the first and second conductors 40, 60 can extend between the blind hole 20 and the through hole 30 inside the semiconductor substrate 10 through the communication path.

Such changes and modifications are to be understood as being within the scope of the present invention as defined by the appended claims.

What is claimed is:

1. A semiconductor device comprising:
a semiconductor substrate having a front surface and a back surface opposite to the front surface, the semiconductor substrate including a first region and a second region located adjacent to the first region;
a first conductor;
an insulator; and
a second conductor, wherein
the first region includes a plurality of blind holes, each blind hole having an opening on the front surface and a bottom defined by the back surface,
the second region includes a through hole extending through the semiconductor substrate from the front surface to the back surface,
a width of each blind hole is less than a width of the through hole,
the first conductor includes a first portion located on an inner surface of each blind hole, a second portion located on the first surface around the opening of each blind hole, and a third portion located on an inner surface of the through hole,
the insulator includes a first portion located on the first portion of the first conductor, a second portion located on the second portion of the first conductor, and a third portion located on the third portion of the first conductor,
the second conductor includes a first portion located on the first portion of the insulator and electrically insulated from the first portion of the first conductor, a second portion located on the second portion of the insulator and electrically insulated from the second portion of the first conductor, and a third portion located on the third portion of the insulator and electrically insulated from the third portion of the first conductor,
the first portion and the second portion of the first conductor are joined to form a first single continuous conductor,
the first portion and the second portion of the second conductor are joined to form a second single continuous conductor,
the first portion and the second portion of the insulator are joined to form a single continuous insulator,
the first single continuous conductor, the second single continuous conductor, and the single continuous insulator form a capacitor having a predetermined capacitance,
the third portion of the first conductor is electrically connected to the first portion and the second portion of the first conductor so that the first portion and the second portion of the first conductor are drawn through the third portion of the first conductor to the back surface of the semiconductor substrate, and the third portion of the second conductor is electrically connected to the first portion and the second portion of the second conductor so that the first portion and the second portion of the second conductor are drawn through the third portion of the second conductor to the back surface of the semiconductor substrate.

2. The semiconductor device according to claim 1, wherein
the first conductor further includes a fourth portion located on the first surface around an opening of the through hole,
the insulator further includes a fourth portion located on the fourth portion of the first conductor,
the second conductor further includes a fourth portion located on the fourth portion of the insulator and electrically insulated from the fourth portion of the first conductor,
the first portion, the second portion, the third portion, and the fourth portion of the first conductor are joined to form the first single continuous conductor,
the first portion, the second portion, the third portion, and the fourth portion of the second conductor are joined to form the second single continuous conductor, and
the first portion, the second portion, the third portion, and the fourth portion of the insulator are joined to form the single continuous insulator.

3. The semiconductor device according to claim 1, wherein
each blind hole has a circular shape with a first diameter,
the through hole has a circular shape with a second diameter, and
the first diameter is less than the second diameter.

4. The semiconductor device according to claim 1, wherein
each blind hole has a hexagonal shape,
the plurality of blind holes is arrange to form a honeycomb structure, and
the maximum width of the hexagonal shape is less than the width of the through hole.

5. The semiconductor device according to claim 1, wherein
each blind hole has a rectangular shape with a long side and a short side, and
the width of each blind hole along the long side is less than the width of the through hole.

6. The semiconductor device according to claim 1, wherein
the plurality of blind holes is arranged in a concentric pattern,
one of the plurality of blind holes is located in the center of the concentric pattern,
the others of the plurality of blind holes are located around the one of the plurality of blind holes, and
each of the others of the plurality of blind holes has a ring shape.

7. A method of manufacturing a semiconductor device comprising:
preparing a semiconductor substrate having a front surface and a back surface opposite to the front surface;
forming a plurality of first blind holes and a second blind hole on the front surface side of the semiconductor substrate in such a manner that a depth of the second blind hole is less than a depth of each first blind hole measured from the front surface of the semiconductor substrate;
forming a first single continuous conductor on the front surface side of the semiconductor substrate, the first single continuous conductor having a first portion formed on an inner surface of each first blind hole, a second portion formed on the first surface around an opening of each first blind hole, and a third portion formed on an inner surface of the second blind hole, and a fourth portion formed on the first surface around an opening of the second blind hole;
forming a single continuous insulator on the front surface side of the semiconductor substrate, the single continuous insulator having a first portion formed on the first portion of the first single continuous conductor, a second portion formed on the second portion of the first single continuous conductor, a third portion formed on the third portion of the first single continuous conductor, and a fourth portion formed on the fourth portion of the first single continuous conductor;
forming a second single continuous conductor on the front surface side of the semiconductor substrate, the single continuous insulator having a first portion formed on the first portion of the single continuous insulator, a second portion formed on the second portion of the single continuous insulator, a third portion formed on the third portion of the single continuous insulator, and a fourth portion formed on the fourth portion of the single continuous insulator;
thinning the semiconductor substrate from the back surface side until the third portion of the first single continuous conductor and the third portion of the single continuous insulator are exposed to the back surface of the semiconductor substrate; and
removing the third portion of the single continuous insulator exposed to the back surface of the semiconductor substrate so that the third portion of the second single continuous conductor is exposed to the back surface of the semiconductor substrate.

8. The method according to claim 7, wherein;
the depth of the second blind hole is made less than the depth of each first blind hole by forming of the plurality of first blind holes and the second blind hole at the same time by a dry etching process after causing a width of each first blind hole to be less than a width of the second blind hole.

* * * * *